(12) United States Patent
Cordero et al.

(10) Patent No.: US 8,930,776 B2
(45) Date of Patent: Jan. 6, 2015

(54) IMPLEMENTING DRAM COMMAND TIMING ADJUSTMENTS TO ALLEVIATE DRAM FAILURES

(75) Inventors: Edgar R. Cordero, Round Rock, TX (US); Joab D. Henderson, Pflugerville, TX (US); Divya Kumar, Austin, TX (US); Jeffrey A. Sabrowski, Leander, TX (US); Anuwat Saetow, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 205 days.

(21) Appl. No.: 13/598,072

(22) Filed: Aug. 29, 2012

(65) Prior Publication Data

US 2014/0068322 A1 Mar. 6, 2014

(51) Int. Cl.
*G06F 11/00* (2006.01)

(52) U.S. Cl.
USPC ........................................................ 714/47.2

(58) Field of Classification Search
USPC ........................................................ 714/47.2
See application file for complete search history.

(56) References Cited

U.S. PATENT DOCUMENTS

| | | | |
|---|---|---|---|
| 6,434,082 B1 | 8/2002 | Hovis et al. | |
| 6,971,051 B2 | 11/2005 | Taylor et al. | |
| 7,733,723 B2 | 6/2010 | Yang | |
| 7,984,357 B2 * | 7/2011 | Kirscht et al. | 714/763 |
| 8,103,900 B2 * | 1/2012 | Fry et al. | 714/6.1 |
| 2005/0182988 A1 * | 8/2005 | McBride et al. | 713/401 |
| 2005/0273552 A1 | 12/2005 | Brazis et al. | |
| 2009/0006837 A1 * | 1/2009 | Rothman et al. | 713/100 |
| 2009/0049341 A1 * | 2/2009 | Cases et al. | 714/39 |
| 2010/0005202 A1 * | 1/2010 | Ferraiolo et al. | 710/51 |
| 2011/0029807 A1 * | 2/2011 | Fry et al. | 714/5 |
| 2011/0185218 A1 | 7/2011 | Nygren et al. | |
| 2011/0185256 A1 * | 7/2011 | Nygren et al. | 714/758 |
| 2011/0208989 A1 | 8/2011 | Nygren et al. | |
| 2011/0239061 A1 | 9/2011 | Li | |
| 2011/0296266 A1 | 12/2011 | Song et al. | |
| 2012/0239996 A1 * | 9/2012 | Higeta et al. | 714/746 |
| 2013/0232372 A1 * | 9/2013 | Sakamaki et al. | 713/500 |

\* cited by examiner

*Primary Examiner* — Bryce Bonzo
(74) *Attorney, Agent, or Firm* — Joan Pennington

(57) ABSTRACT

A method, system and computer program product are provided for implementing command timing adjustments to alleviate Dynamic Random Access Memory (DRAM) failures in a computer system. A predefined DRAM failure is detected. Responsive to the detected failure, a set of timers is adjusted for controlling predetermined timings used to access the DRAM. Responsive to the failure being resolved by the adjusted set of timers, checking for a predetermined level of performance is performed.

18 Claims, 4 Drawing Sheets

IMPLEMENTING DRAM COMMAND TIMING ADJUSTMENTS TO ALLEVIATE DRAM FAILURES

FIELD OF THE INVENTION

The present invention relates generally to the data processing field, and more particularly, relates to a method, system and computer program product for implementing command timing adjustments to alleviate Dynamic Random Access Memory (DRAM) failures in a computer system.

DESCRIPTION OF THE RELATED ART

Modern computer systems typically are configured with a large amount of memory in order to provide data and instructions to one or more processors in the computer systems. Reliability, Availability and Serviceability (RAS) are important features of any memory and computer system.

Main memory of the computer system is typically large, often many GB (gigabytes) and is typically implemented in DRAM. In a computer system using DRAM memory, failures can occur on reads or writes.

A need exists for an effective mechanism for alleviating Dynamic Random Access Memory (DRAM) read and write failures. It is desirable to provide such mechanism that effectively enables recovery from DRAM read and write errors.

SUMMARY OF THE INVENTION

Principal aspects of the present invention are to provide a method, system and computer program product for implementing command timing adjustments to alleviate Dynamic Random Access Memory (DRAM) failures in a computer system. Other important aspects of the present invention are to provide such method, system and computer program product substantially without negative effects and that overcome many of the disadvantages of prior art arrangements.

In brief, a method, system and computer program product are provided for implementing command timing adjustments to alleviate Dynamic Random Access Memory (DRAM) failures in a computer system. A predefined DRAM failure is detected. Responsive to the detected failure, a set of timers is adjusted for controlling predetermined timings used to access the DRAM. Responsive to the failure being resolved by the adjusted set of timers, checking for a predetermined level of performance is performed.

In accordance with features of the invention, detecting a predefined failure includes identifying a set threshold of errors to specific Dual In-Line Memory Modules (DIMMs). Detecting a predefined failure includes identifying a set fail rate and saving the identified set fail rate, original timing parameter values, and trace arrays surrounding the detected predefined failure are saved.

In accordance with features of the invention, the set of timers are adjusted, for example, by a predetermined percentage of margin or by a predetermined value determined from characterization. The set of timers, for example include read-to-read (R-R) on the same rank or on a different rank, write-to-write (W-W) on the same rank or on a different rank, refresh to another command, refresh to refresh, and low power mode entry/exit times. The set of timers could only be invoked at the minimum required level to affect the fail, for example, by a memory controller.

In accordance with features of the invention, responsive to a user selection, a performance recovery routine optionally is performed. The performance recovery routine includes tightening or restoring of timer values that were previously adjusted in response to the predefined failure in a manner that gains back any performance losses while ensuring that the predefined failure does not reoccur.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method, system and computer program product are provided for implementing command timing adjustments to alleviate Dynamic Random Access Memory (DRAM) failures in a computer system.

Figure 1:
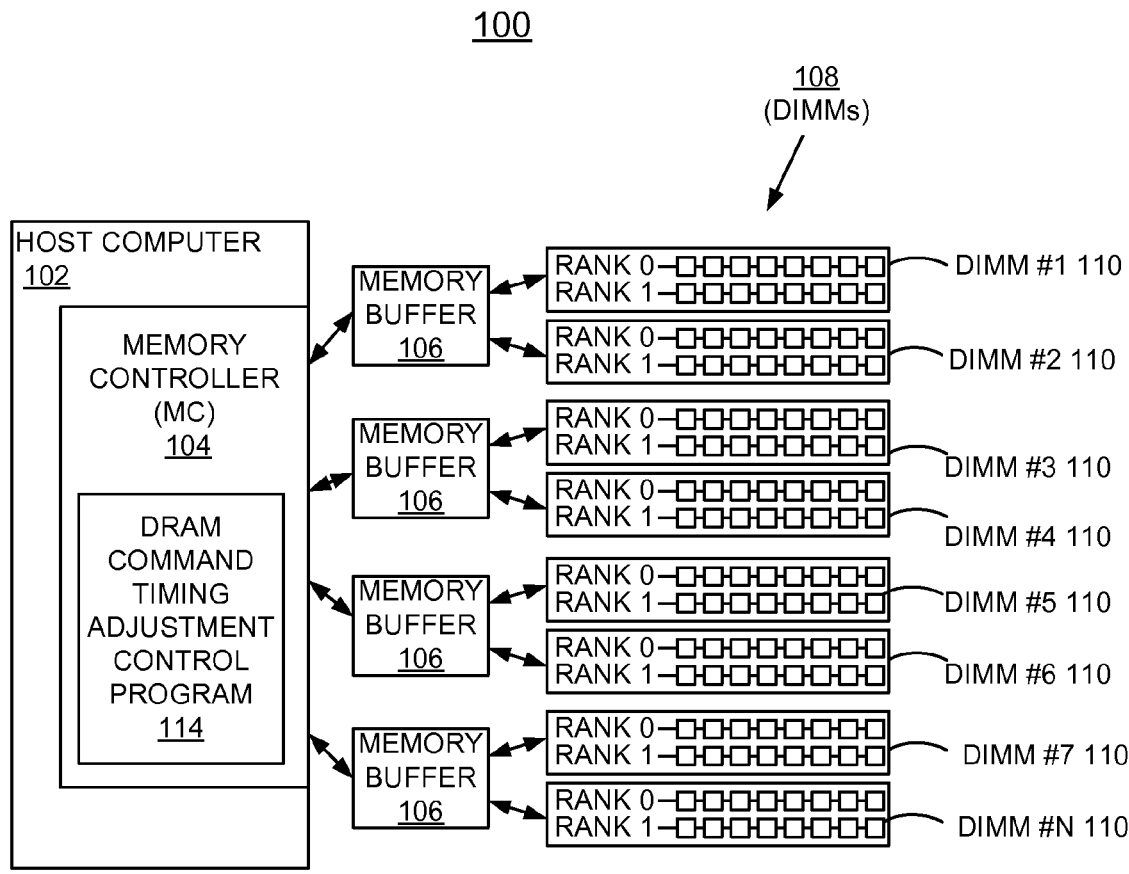
FIG. 1 is a block diagram representation illustrating an example system for implementing command timing adjustments to alleviate Dynamic Random Access Memory (DRAM) failures in accordance with the preferred embodiment.

Having reference now to the drawings, in FIG. 1, there is shown an example computer system generally designated by the reference character 100 for implementing command timing adjustments to alleviate Dynamic Random Access Memory (DRAM) failures in accordance with the preferred embodiment.

Computer system 100 includes a host computer 102 including a memory controller 104 coupled by at least one or a plurality of memory buffers 106 or memory buffer chip 106 to a system dynamic random access memory (DRAM) 108, such as a plurality of Dual In-Line Memory Modules (DIMMs) 1-N, 110.

Computer system 100 includes a DRAM command timing adjustment control program 114 of the preferred embodiment. Memory controller 104 is suitably programmed by the DRAM command timing adjustment control program 114 to execute the flow charts of FIGS. 2 and 3 of the preferred embodiment. Computer system 100 implements command timing adjustments to alleviate Dynamic Random Access Memory (DRAM) failures in accordance with the preferred embodiments.

Computer system 100 is shown in simplified form sufficient for understanding the present invention. The illustrated computer system 100 is not intended to imply architectural or functional limitations. The present invention can be used with various hardware implementations and systems and various other internal hardware devices, for example, multiple main processors and various DRAM arrangements.

Figure 2:
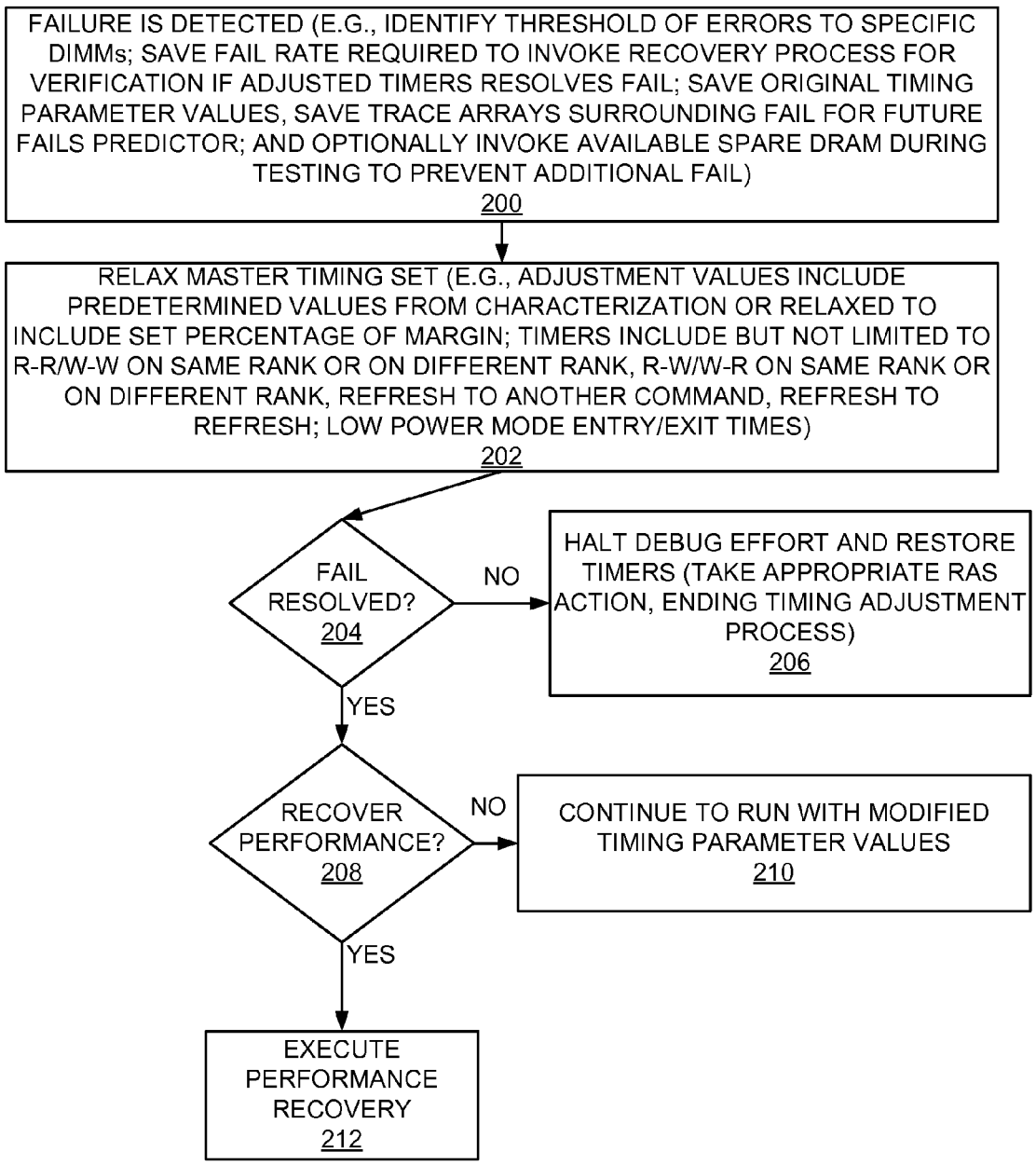
FIG. 2 is a high level flow chart illustrating exemplary operations of the example system of FIG. 1 for implementing command timing adjustments to alleviate Dynamic Random Access Memory (DRAM) failures in accordance with the preferred embodiment.
Figure 3:
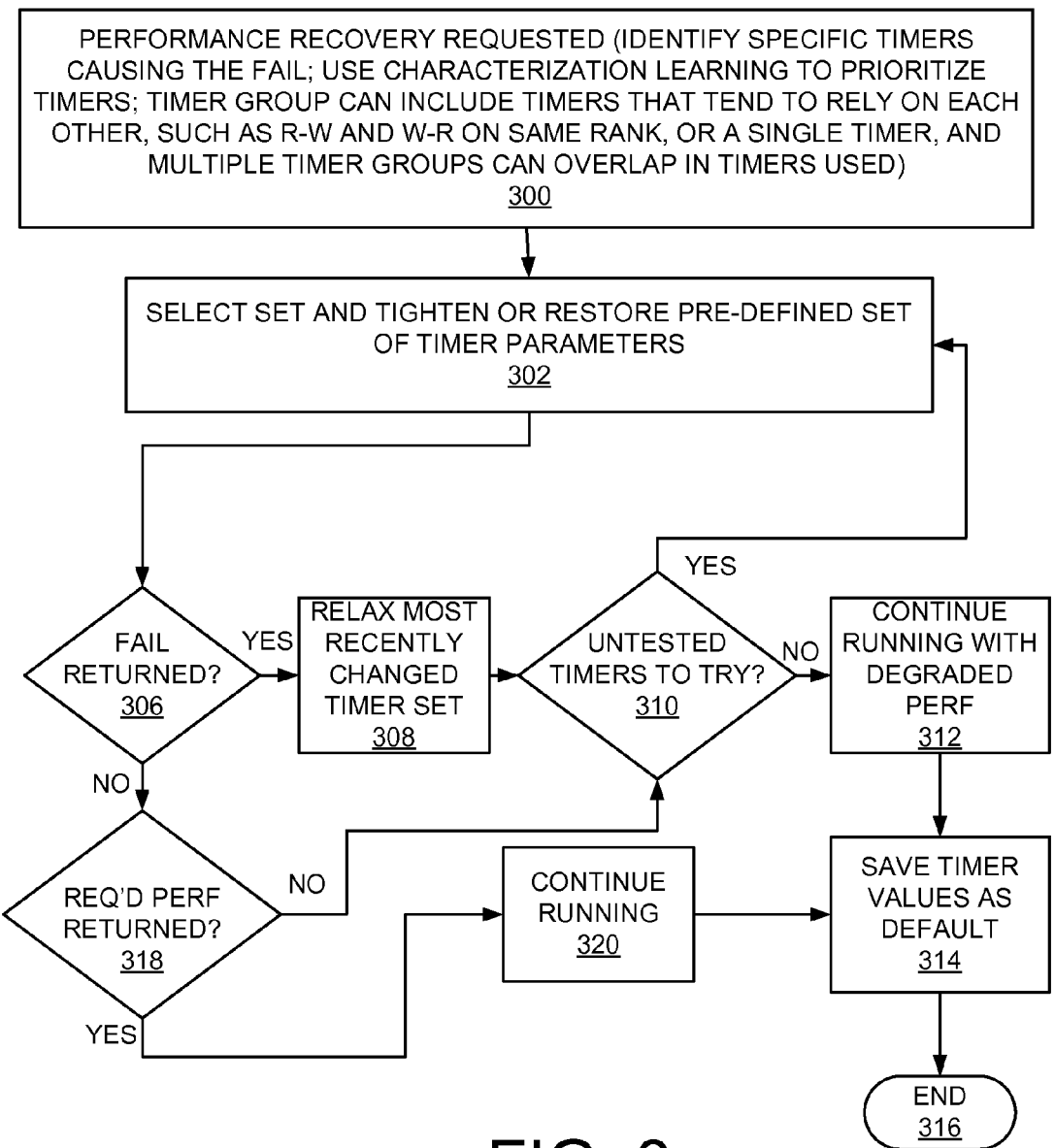
FIG. 3 is a high level flow chart illustrating exemplary operation of an example performance recovery process operations of the example system of FIG. 1 for implementing command timing adjustments to alleviate Dynamic Random Access Memory (DRAM) failures in accordance with the preferred embodiment.

Referring to FIGS. 2 and 3, there are shown respective flow charts illustrating exemplary operations of the example system 100 for implementing command timing adjustments to alleviate Dynamic Random Access Memory (DRAM) failures in accordance with preferred embodiments of the invention.

In FIG. 2, exemplary operations start as indicated at a block 200 with detecting a predefined DRAM failure. At block 200, a threshold of errors to specific DIMMs optionally is required to meet criteria for invoking the timing adjustments process with the predefined DRAM failure being detected. At block 200, the fail rate required to invoke this process should be saved for verification if the adjusted timers resolves the fail. Original timing parameter values and trace arrays surrounding the fail should also be saved as a predictor of future fails at block 200. Also at block 200, spare DRAM, if available, could be invoked during testing to prevent an additional fail from bringing down the system.

As indicated at a block 202, a master timing set of timers is relaxed. At block 202, the adjustment values could be predetermined from characterization or relaxed to include a percentage of margin. At block 202, the master timing set of timers could include but not limited to read-to-read (R-R) on the same rank or on a different rank, write-to-write (W-W) on the same rank or on a different rank, refresh to another command, refresh to refresh, low power mode entry/exit times, and the like. The set of timers could only be invoked at the minimum required level to affect the fail, for example, by a memory controller.

As indicated at a decision block 204, it is determined if the failure has been resolved with these timers adjusted. An initial failure rate can be used to calculate how long to wait before making this decision. Alternatively, a user can elect to wait longer before declaring the fail resolved, or to check sooner to improve the performance at decision block 204.

At decision block 204, it is determined if the fail is resolved. If the fail is not resolved, appropriate RAS action should be taken and this process ends as indicated at a block 206. As indicated at a decision block 208, the user can decide whether to recover performance after the fail is resolved. At decision block 208, the user can decide whether to run with the possible reduced performance or to take action to possibly improve or recover the performance, for example, by narrowing down specific timers that are causing the fail. Responsive to the user selection to run with the possible reduced performance, running in this mode is continued as indicated at a block 210. Otherwise, a performance recovery process is executed as indicated at a block 212, for example, as illustrated and described with respect to FIG. 3.

In FIG. 3, exemplary operations of an example performance recovery process in accordance with preferred embodiments of the invention start as indicated at a block 300. At block 300, prior to executing this process, groups of timers should be determined, and characterization learning could be used to prioritize timers, and a group could include timers that tend to rely on each other, such as R-W/W-R same rank or a group contain a single timer. Also at block 300, if desired, multiple groups could overlap in the timers they utilize, this would allow one group to vary R-W and W-R on the same rank together, then another group to only vary R-W or W-R.

When performance recovery is requested, the performance recovery process is started by selecting a set of timers and tightening or restoring a predefined set of timing parameters as indicated at a block 302.

As indicated at a decision block 306, it is determined if the fail returned. At decision block 306 after applying the settings, waiting is provided to determine if the fail has been resolved, such as by using the same mechanism as used at decision block 204 in FIG. 2. For example, the initial failure rate can be used to calculate how long to wait before making this decision, and the calculation could include weights set by the user to wait longer before declaring the fail resolved, or to check sooner to improve the performance.

When the fail has not been resolved, then the most recent timing changes are relaxed to values determined by block 202, as indicated at a block 308. Then checking for untested timers to try is performed as indicated at a decision block 310. When untested timers to try are identified at decision block 310, then the operations return to block 302 and continue with selecting a set of timers and tightening a predefined set of timing parameters. Otherwise if the fail has not been resolved and there are no additional timers to use as determined at decision block 310, the system will continue running with possibly degraded performance as indicated at a block 312. As indicated at a block 314, time values are saved as default values, and the process is complete as indicated at a block 316.

When determined at decision block 306 that the fail has been resolved, then it is determined if the required performance has returned as indicated at a decision block 318. The user is allowed to decide if the performance impact is too large and the failure resource should be deconfigured instead. If the required performance is not identified at decision block 318, then the operations return to decision block 310 to check for untested timers to try and continue as described above.

If the required performance is identified at decision block 318, then the system will continue running as indicated at a block 320 and, as before time values are saved as default values at block 314. The process is complete ending at block 316.

Figure 4:
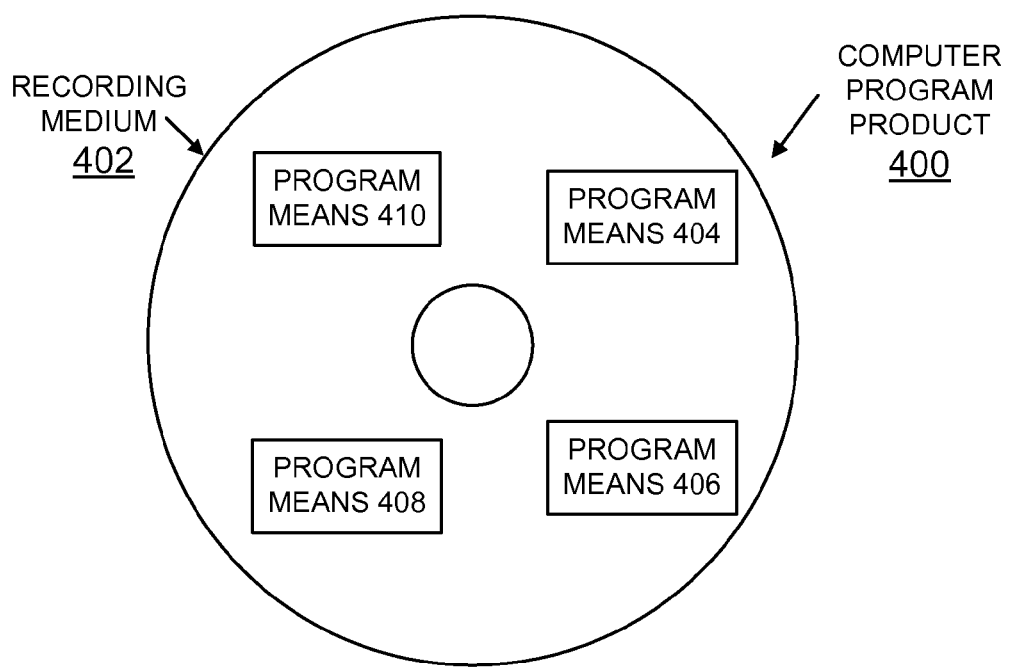
FIG. 4 is a block diagram illustrating a computer program product in accordance with the preferred embodiment.

Referring now to FIG. 4, an article of manufacture or a computer program product 400 of the invention is illustrated. The computer program product 400 is tangibly embodied on a non-transitory computer readable storage medium that includes a recording medium 402, such as, a floppy disk, a high capacity read only memory in the form of an optically read compact disk or CD-ROM, a tape, or another similar computer program product. Recording medium 402 stores program means 404, 406, 408, and 410 on the medium 402 for carrying out the methods for implementing command timing adjustments to alleviate Dynamic Random Access Memory (DRAM) failures of the preferred embodiment in the system 100 of FIG. 1.

A sequence of program instructions or a logical assembly of one or more interrelated modules defined by the recorded program means 404, 406, 408, and 410, direct the computer system 100 for implementing command timing adjustments to alleviate Dynamic Random Access Memory (DRAM) failures of the preferred embodiment.

While the present invention has been described with reference to the details of the embodiments of the invention shown in the drawing, these details are not intended to limit the scope of the invention as claimed in the appended claims.

What is claimed is:

1. A method for implementing command timing adjustments to alleviate Dynamic Random Access Memory (DRAM) failures in a computer system comprising:
   detecting a predefined DRAM failure;
   responsive to detecting the predefined DRAM failure, adjusting a set of timers for controlling predetermined timings used to access DRAM including selectively providing predetermined adjustment values from characterization or relaxed to include a set percentage of margin; and
   responsive to the predefined DRAM failure being resolved by the adjusted set of timers, checking for a predetermined level of performance.

2. The method as recited in claim 1 wherein detecting said predefined DRAM failure includes identifying a set threshold of errors to specific Dual In-Line Memory Modules (DIMMs).

3. The method as recited in claim 1 wherein detecting said predefined DRAM failure includes identifying a set fail rate and saving the identified set fail rate.

4. The method as recited in claim 3 includes saving current timer values and identifying trace arrays surrounding said detected predefined DRAM failure and saving the identified trace arrays surrounding said detected predefined DRAM failure.

5. The method as recited in claim 3 includes invoking spare DRAM for use during testing.

6. The method as recited in claim 1 wherein adjusting said set of timers for controlling predetermined timings used to access the DRAM includes providing said set of timers including at least one of a read-to-write (R-W) timer, a write-to-read (W-R) timer, a read-to-read (R-R) timer, a write-to-write (W-W) timer, a refresh to another command timer, a refresh to refresh timer, and a low power mode timer.

7. The method as recited in claim 1 includes performing a performance recovery routine responsive to a user selection.

8. The method as recited in claim 7 includes identifying specific timers causing said detected predefined DRAM failure and selecting a timer group and adjusting a predefined set of timer parameters.

9. A system for implementing command timing adjustments to alleviate Dynamic Random Access Memory (DRAM) failures in a computer system comprising:
   a DRAM memory;
   a memory controller coupled to the DRAM;
   said memory controller detecting a predefined DRAM failure;
   said memory controller responsive to detecting the predefined DRAM failure, adjusting a set of timers for controlling predetermined timings used to access the DRAM;
   said memory controller providing said set of timers including at least one of a read-to-write (R-W) timer, a write-to-read (W-R) timer, a read-to-read (R-R) timer, a write-to-write (W-W) timer, a refresh to another command timer, a refresh to refresh timer, and a low power mode timer; and
   said memory controller responsive to the predefined DRAM failure being resolved by the adjusted set of timers, checking for a predetermined level of performance.

10. The system as recited in claim 9 wherein said memory controller includes a DRAM command timing adjustment control computer program product tangibly embodied on a non-transitory computer readable storage medium.

11. The system as recited in claim 9 wherein said memory controller detecting a predefined DRAM failure includes said memory controller identifying a set threshold of errors to specific Dual In-Line Memory Modules (DIMMs).

12. A system for implementing command timing adjustments to alleviate Dynamic Random Access Memory (DRAM) failures in a computer system comprising:
   a DRAM memory;
   a memory controller coupled to the DRAM;
   said memory controller detecting a predefined DRAM failure;
   said memory controller responsive to detecting the predefined DRAM failure, adjusting a set of timers for controlling predetermined timings used to access the DRAM;
   said memory controller responsive to the predefined DRAM failure being resolved by the adjusted set of timers, checking for a predetermined level of performance; and
   said memory controller responsive to a user selection, performing a performance recovery routine.

13. The system as recited in claim 12 wherein said memory controller performing said performance recovery routine includes said memory controller identifying specific timers causing the predefined failure.

14. The system as recited in claim 12 includes said memory controller selecting a timer group and adjusting a predefined set of timer parameters.

15. The system as recited in claim 9 wherein said memory controller detecting said predefined DRAM failure includes said memory controller identifying a set fail rate and saving the identified set fail rate.

16. The system as recited in claim 15 includes said memory controller identifying trace arrays surrounding said detected predefined DRAM failure and saving the identified trace arrays surrounding said detected predefined DRAM failure.

17. The system as recited in claim 15 includes said memory controller invoking spare DRAM for use during testing.

18. The system as recited in claim 9 includes said memory controller adjusting said set of timers for controlling predetermined timings used to access the DRAM includes selectively providing predetermined adjustment values from characterization or to include a set percentage of margin.

* * * * *